(12) United States Patent
Yasukawa et al.

(10) Patent No.: US 6,400,323 B2
(45) Date of Patent: Jun. 4, 2002

(54) ANTENNA COIL FOR IC CARD AND MANUFACTURING METHOD THEREOF

(75) Inventors: Hidenori Yasukawa; Hiroyuki Sakamoto; Toshinori Takano; Tadashi Kubota; Hiroshi Tada; Masami Yoshimoto, all of Osaka (JP)

(73) Assignee: Toyo Aluminium Kabushiki Kaisha, Osaka (JP)

( * ) Notice: Subject to any disclaimer, the term of this patent is extended or adjusted under 35 U.S.C. 154(b) by 0 days.

(21) Appl. No.: 09/886,337

(22) Filed: Jun. 21, 2001

(30) Foreign Application Priority Data

Jun. 23, 2000 (JP) ........................................ 2000-188592
Nov. 21, 2000 (JP) ........................................ 2000-354383

(51) Int. Cl.⁷ .................................................. H01Q 1/36
(52) U.S. Cl. ................................. 343/700 MS; 343/895
(58) Field of Search ........................... 343/700 MS, 895; 29/600; 340/572.4, 572.6, 572.7; 235/385, 491, 492

(56) References Cited

U.S. PATENT DOCUMENTS

| | | | |
|---|---|---|---|
| 5,541,399 A | * 7/1996 | de Vall | 235/491 |
| 5,608,417 A | * 3/1997 | de Vall | 340/572.5 |
| 5,695,860 A | 12/1997 | Iamichi et al. | 428/209 |
| 5,999,409 A | * 12/1999 | Ando et al. | 235/492 |
| 6,154,137 A | * 11/2000 | Goff et al. | 340/572.4 |
| 6,194,993 B1 | * 2/2001 | Hayashi et al. | 235/435 |
| 6,203,655 B1 | * 3/2001 | Fujikawa et al. | 156/272.8 |

FOREIGN PATENT DOCUMENTS

| | | |
|---|---|---|
| DE | 19 731969 | 8/1998 |
| GB | 1415168 | 11/1975 |
| JP | 2000-192260 | 7/2000 |

\* cited by examiner

*Primary Examiner*—Tan Ho
(74) *Attorney, Agent, or Firm*—W. F. Fasse; W. G. Fasse

(57) ABSTRACT

An antenna coil for an IC card includes a base material of a resin film having the thickness of at least 15 μm and at most 70 μm, and a circuit pattern layer formed on a surface of the base material, having the thickness of at least 7 μm and at most 60 μm formed of an aluminum foil containing aluminum by at least 97.5 mass % and at most 99.7 mass %. On the surface of the resin film base material, an aluminum foil containing aluminum is fixed by using a polyurethane based adhesive layer containing an epoxy resin, a resist ink layer having a prescribed pattern is printed on the foil, the foil is etched using the resist ink layer as a mask to form a circuit pattern layer, and the resist ink layer is removed.

20 Claims, 8 Drawing Sheets

ANTENNA COIL FOR IC CARD AND MANUFACTURING METHOD THEREOF

BACKGROUND OF THE INVENTION

1. Field of the Invention

The present invention relates to an antenna coil for an IC card and to the method of manufacturing the same. More specifically, the present invention relates to an antenna coil for an IC card in which a circuit pattern layer of the antenna coil for the IC card is formed of an aluminum foil, as well as to the method of manufacturing the same. Here, the aluminum foil is not limited to a pure aluminum foil but it also includes an aluminum alloy foil.

2. Description of the Related Art

Recently, IC cards have been developed remarkably, and the use of the IC cards is widening to telephone cards, credit cards, pre-paid cards, cash cards, ID cards and card keys. As a base material for the conventional IC cards, resin film such as a polyimide film, a general purpose polyethylene terephthalate (PET) film or the like has been used. A copper foil or a high-purity aluminum foil is laminated on each side of the resin film and subjected to etching, whereby a circuit pattern layer of copper or aluminum is formed on a surface of the base material, providing an antenna coil for the IC card.

The process of etching the copper foil for forming the circuit pattern layer takes too much time, and therefore production efficiency is low. Further, after the etching process of the copper foil, an oxidizing reaction tends to occur at the surface of the copper foil, making instable the electrical resistance value of the surface of the circuit pattern.

When such a resin as described above is used as a base material of the antenna coil for IC cards and copper foils are to be laminated on both surfaces of the base material, it is necessary to attain electrical conduction between the circuit pattern layers of the copper foils formed on opposing surfaces of the base material. For this purpose, a plating layer of a through hole is formed between the circuit pattern layers of the copper foil, or printing with silver paste is performed. Such process steps lead to increased cost for manufacturing the antenna coil for IC cards and lowers production efficiency.

When a high-purity aluminum foil (having the purity of at least 99.8 mass %) is used as the material for forming the circuit pattern layer, superior oxidation resistance can be attained. Etching, however, takes longer time, resulting in low production efficiency. An IC card having the circuit pattern layer formed by using the high-purity aluminum foil is susceptible to possible disconnection of the circuit caused by emboss processing or imprinting such as inscription provided on the final product, thus reliability is not very high.

SUMMARY OF THE INVENTION

An object of the present invention is to provide an antenna coil for an IC card having superior processability and allowing higher efficiency of production.

The antenna coil for an IC card in accordance with the present invention includes a base material containing resin and having a thickness of at least 15 μm and at most 70 μm, and a circuit pattern layer formed on a surface of the base material and having the thickness of at least 7 μm and at most 60 μm formed of a foil containing aluminum of at least 97.5 mass % and at most 99.7 mass %.

In the antenna coil for an IC card in accordance with the present invention, the foil constituting the circuit pattern layer has low aluminum purity, and therefore etch rate to form the circuit pattern layer can be improved, and hence production efficiency can be improved. Further, as the circuit pattern layer contains aluminum of the limited purity as mentioned above, it is possible to maintain electrical resistance value of the surface stable over a long time. Thus, an antenna coil for an IC card having higher stability over a long period of time can be attained.

Preferably, in the antenna coil for an IC card in accordance with the present invention, the foil constituting the circuit pattern layer includes iron by at least 0.7 mass % and at most 1.8 mass %.

Here, as the aluminum foil constituting the circuit pattern layer contains iron by a limited content, it has such strength and elongation that lead to superior processability. Therefore, during the steps of manufacturing the antenna coil for an IC card or during emboss processing of the final product, possible tearing of the aluminum foil or disconnection of the circuits can be prevented. Further, as the etch rate for forming the circuit pattern layer can be improved, production efficiency can be improved.

Preferably, in the antenna coil for an IC card in accordance with the present invention, the aluminum foil constituting the circuit pattern layer contains silicon by at least 0.03 mass % and at most 0.5 mass %.

Preferably, in the antenna coil for an IC card in accordance with the present invention, the aluminum foil constituting the circuit pattern layer contains silicon by at least 0.03 mass % and at most 0.5 mass % and copper by at most 0.3 mass %.

The polyimide film used as the base material of the antenna coil for an IC card is expensive, and in addition it absorbs much moisture, resulting in variation in electrical characteristic of the antenna coil during use of the IC card, possibly causing a malfunction. When a general purpose PET film is used as the base material of the antenna coil for an IC card, there would be an undesirable shrinkage as the base material is heated when an IC chip is mounted on the surface of the circuit pattern layer, for example. Therefore, dimensional accuracy of the circuit pattern layer formed on the base material of general purpose PET file becomes instable, and in addition, smoothness of the base material deteriorates.

Therefore, it is preferred that the base material includes a resin of which thermal contraction when held at 150° C. for 30 minutes is at most 0.3%.

Here, as the base material includes the resin having such a limited thermal contraction coefficient, contraction can be effectively prevented in the step of thermal processing at the time of mounting the IC chip, for example. Hence, dimensional accuracy of the circuit pattern layer can be maintained stable and the smoothness of the base material can also be maintained satisfactorily.

Preferably, the resin used as the base material of the antenna coil for an IC card in accordance with the present invention is at least one selected from the group consisting of low profile polyethylene terephthalate (PET) and low profile polyethylene naphthalate (PEN).

Preferably, in the antenna coil for an IC card in accordance with the present invention, the circuit pattern layer includes a first circuit pattern formed on one surface of the base material, and a second circuit pattern layer formed on the other surface of the base material. Here, it is preferred that at least a part of the first circuit pattern layer is in contact with at least a part of the second circuit pattern, penetrating through the base material. This enables electrical conduction between the first and second circuit pattern layers. Contact between the first and second circuit pattern layers can be attained easily by a crimping process.

Preferably, the antenna coil for an IC card in accordance with the present invention further includes an adhesive layer interposed between the circuit pattern layer and the base material for bonding therebetween. It is preferred that the adhesive layer includes a polyurethane based adhesive containing an epoxy resin.

There is a problem that when the manufactured antenna coils for the IC cards are stacked on one another or wound as a belt-shaped roll for shipping or storage, overlapping portions are adhered with each other (hereinafter referred to as blocking). Therefore, when an IC card is to be manufactured using the antenna coil, separation of the adhered portions of the antenna coils is expected to be difficult, possibly stopping the manufacturing line.

In order to prevent the blocking, excessive adhesive on the resin film as the base material should be removed, or a released paper should be inserted to overlapping portions of the antenna coil. Perfect removal of the adhesive is very difficult. When a releasing paper is inserted, an additional step of removing the release paper becomes necessary in the subsequent manufacturing process. Therefore, in either case, an additional process step is required, resulting in increased cost of manufacturing.

Therefore, it is preferred that the antenna coil for an IC card in accordance with the present invention further includes an underlying coating layer formed on the surface of the base material, inserted between the circuit pattern layer and the base material. As the underlying coating layer is provided on the surface of the base material, even when antenna coils are stacked on one another, the base materials on which circuit pattern layers are formed are not brought into tight adhesion, as the base materials are stacked with underlying coatings positioned therebetween. This prevents blocking. Accordingly, undesired stopping of the manufacturing line of the IC card can be prevented. Here, it is further preferred that the antenna coil for an IC card additionally includes an adhesive layer for bonding positioned between the underlying coating layer and the base material. The adhesive layer preferably includes a polyurethane based adhesive containing an epoxy resin.

Preferably, in the antenna coil for an IC card in accordance with the present invention, the thickness of the underlying coating layer is at least 0.1 $\mu$m and at most 5 $\mu$m.

More preferably, the underlying coating layer includes at least one selected from the group consisting of epoxy based primer, acrylic primer, and vinyl chloride-vinyl acetate copolymer based primer.

The method of manufacturing an antenna coil for an IC card in accordance with the present invention includes the following steps.

(a) On a surface of a base material containing a resin and having the thickness of at least 15 $\mu$m and at most 70 $\mu$m, fixing a foil having the thickness of at least 7 $\mu$m and at most 60 $\mu$m and containing aluminum of at least 97.5 mass % and at most 99.7 mass %, by using an adhesive.

(b) Printing a resist ink layer of a prescribed pattern on the foil.

(c) Etching the foil using the resist ink layer as a mask, to form a circuit pattern layer containing aluminum.

(d) After etching the foil, removing the resist ink layer.

In the method of manufacturing in accordance with the present invention, the circuit pattern layer is formed by using a foil having the limited thickness and containing aluminum of the limited purity as described above, and therefore the time for etching to form the pattern layer can be reduced. Therefore, it becomes possible to improve efficiency of production in manufacturing the antenna coils for IC cards.

Preferably, in the method of manufacturing an antenna coil for an IC card in accordance with the present invention, the step of fixing a foil includes fixing a foil on one surface and on the other surface of the base material. Preferably, the step of forming a circuit pattern layer includes the step of forming a first circuit pattern layer on one surface of the base material and forming a second circuit pattern layer on the other surface of the base material.

Preferably, the method of manufacturing an antenna coil for an IC card in accordance with the present invention further includes the step of bringing at least a part of the first circuit pattern layer into contact with at least a part of the second circuit pattern layer by a crimping process. Here, in order to establish electrical conduction between the first and second circuit pattern layers formed on opposing surfaces of the base material, it is possible to bring into contact at least parts of the first and second circuit pattern layers by the crimping process, and hence conduction can be established through a simple process step. Therefore, as compared with the conventional method of manufacturing, manufacturing cost can be reduced and production efficiency can be improved.

The method of manufacturing an antenna coil for an IC card in accordance with another aspect of the present invention includes the following steps.

(a) Forming an underlying coating layer on one surface of an aluminum foil.

(b) Fixing a base material containing a resin on a surface of the underlying coating layer.

(c) Printing a resist ink layer having a prescribed pattern on the other surface of the aluminum foil.

(d) Etching apart of the aluminum foil using the resist ink layer as a mask to form a circuit pattern layer.

(e) After etching the part of the aluminum foil, removing the resist ink layer.

Preferably, in the method of manufacturing an antenna coil for an IC card in accordance with the present invention, the step of fixing a base material on the surface of the underlying coating layer includes the step of fixing the base material on a surface of the underlying coating layer using a polyurethane based adhesive containing an epoxy resin.

Preferably, in the method of manufacturing an antenna coil for an IC card in accordance with the present invention, the step of fixing the base material includes adhering one surface of the base material onto a surface of the underlying coating layer formed on one surface of a first aluminum foil and adhering the other surface of the base material onto a surface of the underlying coating layer formed on one surface of a second aluminum foil, and the step of forming the circuit pattern layer includes forming the first circuit pattern layer by etching a part of the first aluminum foil on one surface of the base material and forming a second circuit pattern layer by etching a part of the second aluminum foil on the other surface of the base material. It is needless to say that the etching of a part of the first aluminum foil and etching of a part of the second aluminum foil may be performed simultaneously.

As described above, the antenna coil for an IC card in accordance with the present invention is suitable for mass production at a low cost with high efficiency, and has superior processability, dimensional accuracy, heat resistance, stability over time and practical strength. Therefore, the antenna coil can be provided as a component for an IC card that has high reliability and capable of exhibiting stable performance over a long period of time.

Further, the antenna coil for an IC card in accordance with the present invention ensures smooth pay off or supply leaf by leaf without blocking. Therefore, lowering of productivity in the subsequent step of the manufacturing line of the IC card can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
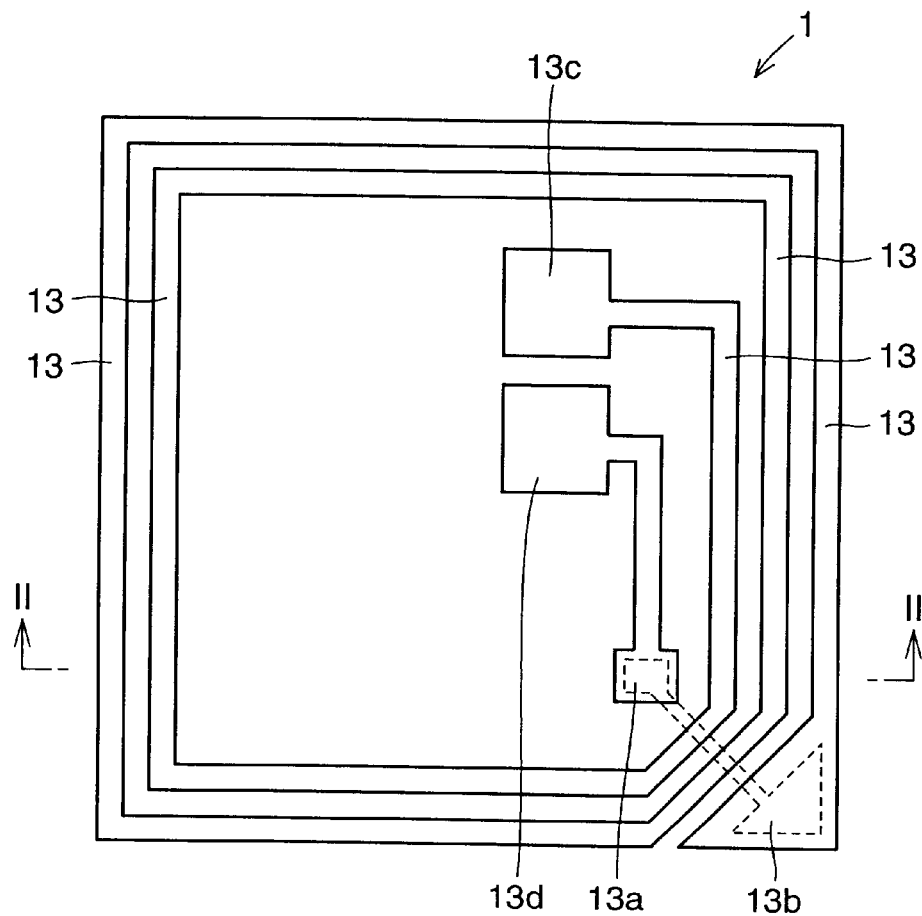
FIG. 1 is a plan view showing an antenna coil for an IC card in accordance with one embodiment of the present invention.
Figure 2:
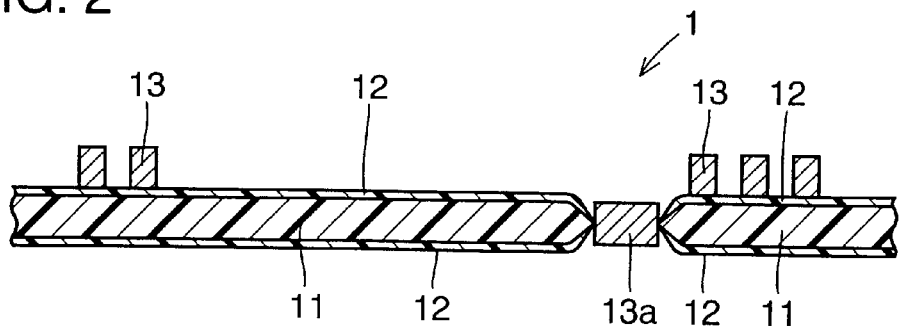
FIG. 2 is a partial cross sectional view taken from the direction of line II—II of FIG. 1.

FIG. 1 is a plan view of the antenna coil for an IC card in accordance with one embodiment of the present invention, and FIG. 2 is a partial cross sectional view taken along the direction of II—II of FIG. 1.

As can be seen from FIGS. 1 and 2, an antenna coil 1 for an IC card includes a resin film base material 11, adhesive layers 12 formed on opposing sides of resin film based material 11, and circuit pattern layers 13 formed of an aluminum film, in accordance with a prescribed pattern on a surface of the adhesive layers 12. The circuit pattern layer 13 is formed in an eddy pattern on the surface of the base material as shown in FIG. 1. At an end portion of circuit pattern layer 13, areas 13c and 13d are formed, on which an IC chip is mounted. The circuit pattern layer denoted by the dotted line in FIG. 1 is positioned on the rear surface of base material 11. The circuit pattern layer 13 formed on the surface of the base material 11 is in contact with the circuit pattern layer 13 formed on the rear surface of base material 11 to be electrically conductive at pressure contact portions 13a and 13b, respectively. The contact is realized by partially destroying the base material 11 and the adhesive layer 12 by the crimping process.

In the above described one embodiment, it is preferred that the aluminum foil used for the circuit pattern layer 13 has the thickness of at least 7 $\mu$m and at most 60 $\mu$m, and that aluminum purity is at least 97.5 mass % and at most 99.7 mass %. More preferably, the thickness should be at least 15 $\mu$m and at most 50 $\mu$m, and aluminum purity is at least 98.0 mass % and at most 99.5 mass %.

When the thickness of the aluminum foil is smaller than 7 $\mu$m, pin holes are generated in large number, and there is a possibility that the foil is torn in the steps of manufacturing. When the thickness of the aluminum foil exceeds 60 $\mu$m, etching process to form the circuit pattern layer 13 increases and the cost of the material increases.

When the purity of aluminum is lower than 97.5 mass %, the impurity contained in the aluminum foil is too large, resulting in too high electrical resistance of circuit pattern layer 13 and significantly degrades corrosion resistance, possibly allowing corrosion with only a small amount of moisture. When the purity of aluminum exceeds 99.7 mass %, corrosion resistance of the aluminum foil is improved too much, resulting in longer time of etching.

More specifically, as the material of circuit pattern layer 13, pure aluminum foil or aluminum alloy foil such as 1030, 1N30, 1050, 1100, 8021 and 8079 in accordance with JIS (AA) representation may be used.

In the present invention, purity of aluminum refers to a value obtained by subtracting a total mass % of main impurity elements including iron (Fe), silicon (Si), copper (Cu), manganese (Mn), magnesium (Mg), zinc (Zn), gallium (Ga), titanium (Ti), zirconium (Zr), nickel (Ni) and chromium (Cr) from 100 mass %.

Preferably, the content of iron (Fe) is 0.7 to 1.8 mass %. In the aluminum foil, preferably, iron content is 0.7 to 1.8 mass %, silicon (Si) content is 0.03 to 0.5 mass %, and more preferably, iron content is 0.7 to 1.8 mass %, silicon content is 0.03 to 0.5 mass % and copper (Cu) content is at most 0.3 mass %.

When the thickness of the aluminum foil is smaller than 7 $\mu$m, pin holes are generated in large number, and there is a possibility of tearing of the foil during the steps of manufacturing. When the thickness of the aluminum foil exceeds 60 $\mu$m, the etching process for forming circuit pattern layer 13 takes much time, and the material cost increases.

The iron content is preferably in the range of 0.7 to 1.8 mass % in view of etch rate, strength and elongation of the aluminum foil, and more preferable range is 0.8 to 1.4 mass %. When iron content is smaller than 0.7 mass %, strength and elongation of the aluminum foil decrease, possibly causing tearing of the aluminum foil and disconnection of the circuitry during the steps of manufacturing or at the time of emboss processing of the final product, and in addition, etch rate becomes extremely low, deteriorating production efficiency. When iron content exceeds 1.8 mass %, coarse iron based compound generates, lowering elongation of the aluminum foil and rolling characteristic during manufacturing of the aluminum foil.

The preferable range of silicon content is 0.03 to 0.5 mass % and more preferable range is 0.05 to 0.3 mass %. When silicon content exceeds 0.5 mass %, crystal grain tends to be larger, possibly lowering strength and elongation of the aluminum foil. When silicon content is smaller than 0.03 mass %, crystal grain refining effect is saturated, while manufacturing cost is increased.

Preferable copper content is at most 0.3 mass %. When copper content exceeds 0.3 mass %, corrosion resistance of the aluminum foil degrades significantly, causing excessive etching and shorter life of IC card. Though the lower limit of copper content is not specifically defined, it may be about 0.005 mass %. When the content is smaller than 0.005 mass %, corrosion resistance is unchanged, while manufacturing cost is increased.

In the aluminum foil, contents of each element of the main impurities including manganese (Mn), magnesium (Mg), zinc (Zn), gallium (Ga), titanium (Ti), zirconium (Zr), nickel (Ni) and chromium (Cr) may be at most 0.1 mass % and in total, 0.3 mass %. When the contents of the impurity elements exceed these values, electric resistance value of the circuit pattern layer excessively increases, performance of the circuitry degrades, and mechanical characteristics such as elongation, emboss processing property and rolling property are possibly degraded. The aluminum matrix may include, as long as the effects of the present invention can be attained, unavoidable impurity elements and a small amount of impurity elements such as boron (B), potassium (K), sodium (Na), chloride (Cl) and calcium (Ca) other than those listed above.

Preferably, the aluminum foil has tensile strength of 70 MPa to 120 MPa and the elongation of at least 4%. When tensile strength and elongation of the aluminum foil are within these ranges, warp or crease is not generated during manufacturing or during use, and therefore there is no possibility of degrading dimensional accuracy of the circuit pattern layer. Further, as there is no possibility of tearing or disconnection, a highly reliable IC card can be provided. The aluminum foil used should preferably be an annealed foil or a semi-annealed foil, and one prepared by rolling to a foil followed by annealing at a temperature of about 250 to about 550° C. is preferred. When a hard aluminum foil having tensile strength exceeding 120 MPa is used, rolling oil tends to remain, and flexibility (rolling property) and processability are unsatisfactory.

A resin film used as the base material of the antenna coil for an IC card in accordance with the present invention is preferably at least one selected from the group consisting of polyethylene (high density polyethylene, low density polyethylene, linear low density polyethylene and the like), polypropylene, polyethylene terephthalate, polyethylene naphthalate, nylon, vinyl chloride, a low profile polyethylene terephthalate (PET) film, a low profile polyethylene naphthalate (PEN) film and the like. Among these, more preferably, the resin is at least one selected from a low profile polyethylene terephthalate (PET) film and a low profile polyethylene naphthalate (PEN) film. It is preferred that the resin film has the thickness in the range of 15 to 70 μm and more preferably in the range of 20 to 50 μm. When the thickness of the base material is smaller than 15 μm, rigidity of a stacked body with the aluminum foil forming the circuit pattern layer is insufficient, resulting in difficulty in working during the manufacturing steps. When the thickness of the base material exceeds 70 μm, it may be difficult to surely perform the crimping process, which will be described later.

It is preferred that the resin film used for the base material has thermal contraction coefficient of at most 0.3% when held at 150° C. for 30 minutes. When thermal contraction coefficient exceeds 0.3%, there arises a problem that dimensional accuracy of the circuit pattern layer formed on the base material is deteriorated.

The thermal contraction coefficient used in the present invention refers to the ratio of linear shrinkage percentage, which is calculated in accordance with the following equation.

$$\text{thermal contraction coeffeicient (\%)} = \frac{L_0 - L}{L_0} \times 100 \qquad \text{[Equation 1]}$$

In the equation, L represents the length of the resin film when held at 150° C. for 30 minutes, and $L_0$ represents original length of the resin film, Adhesion of the aluminum foil for forming the circuit pattern layer and the resin film as the base material is preferably realized by dry lamination using a polyurethane (PU) adhesive containing an epoxy resin. As the polyurethane adhesive containing an epoxy resin, AD506, AD503, AD76-P1 or the like manufactured by Toyo-Morton, Ltd. may be used. As a curing agent, CAT-10 manufactured by the same company may be used, mixed at the ratio of adhesive: curing agent=2 to 12:1. When a common polyurethane adhesive not containing an epoxy resin is used, delamination tends to occur during etching for forming the circuit pattern layer or at the time of mounting the IC chip. This is because the polyurethane adhesive not containing an epoxy resin has inferior chemical resistance or heat resistance.

In order to adhere the aluminum foil for forming the circuit pattern layer on the resin film as a base material, it is preferred that the polyurethane based adhesive containing an epoxy resin is applied by about 1 to about 15 g/m² by weight after drying. When the applied amount is smaller than 1 g/m², adhesiveness of aluminum foil is insufficient. When the amount exceeds 15 g/m², the crimping process, which will be described later, is hindered and manufacturing cost increases.

One embodiment of the method of manufacturing an antenna coil for an IC card in accordance with the present invention will be described in the following. FIGS. 3 to 6 are partial cross sections showing the steps of manufacturing the antenna coil for an IC card in accordance with the present invention. FIGS. 3 to 6 are partial cross sections viewed from the direction along the line II—II of FIG. 1.

Figure 3:
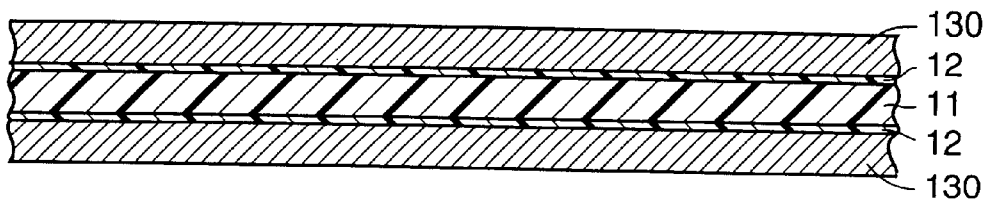
FIGS. 3 to 6 are partial cross sectional views showing in order the steps of manufacturing an antenna coil for an IC card in accordance with one embodiment of the present invention.

As can be seen from FIG. 3, an adhesive layer 12 is formed on each surface of resin film base material 11, and by the adhesive layer 12, aluminum foil 130 is fixed on each surface of resin film base material 11. In this manner, a stacked body of aluminum foils 130 and resin film base material 11 is prepared.

Figure 4:
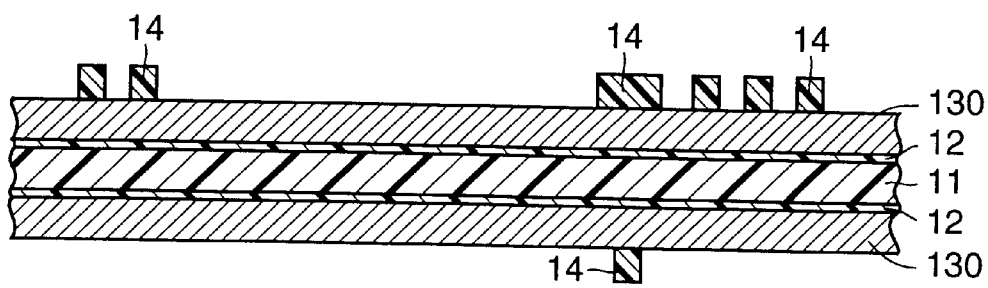

Referring to FIG. 4, a resist ink layer 14 is printed on the surface of aluminum foil 130 so as to have a prescribed eddy pattern in accordance with the specification of the antenna coil. After printing, the process for curing resist ink layer 14 is performed.

Figure 5:
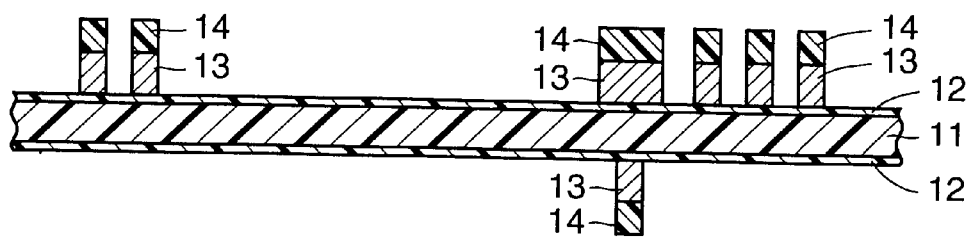

Referring to FIG. 5, using resist ink layer 14 as a mask, aluminum foil 130 is etched, whereby a circuit pattern layer 13 is formed.

Figure 6:
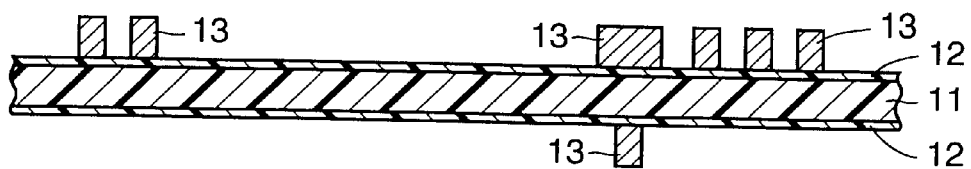

Thereafter, as shown in FIG. 6, resist ink layer 14 is removed.

Finally, crimping process is performed at a prescribed area of circuit pattern layer 13 by using a metal plate having recesses and protrusions and a metal protrusion, whereby a contact portion or a pressure contact portion 13a of the circuit pattern layer is formed, as shown in FIG. 2. In this manner, antenna coil 1 for an IC card in accordance with the present invention is completed.

The resist ink used in the method of manufacturing in accordance with the present invention is not specifically limited. Preferably, an ultraviolet curing resist ink mainly consisting of an alkali soluble resin and an acryl monomer having at least one carboxyl group in the molecule is used. The resist ink allows for gravure printing, has acid resistance and it can be removed easily by an alkali. Therefore, the resist ink is suitable for continuous mass production. By performing gravure printing in a prescribed circuit pattern on an aluminum foil using the resist ink, curing the pattern by irradiating with ultraviolet ray, and removing the resist ink layer through a common method such as acid etching of the aluminum foil using ferric chloride and removal of the resist ink by an alkali such as sodium hydroxide, the circuit pattern layer can be formed.

An acryl monomer having at least one carboxyl group includes, for example, 2-acryloyloxyethyl phthalic acid, 2-acryloyloxyethyl succinic acid, (2-acryloyloxyethyl) hexahydro phthalic acid, 2-acryloyloxypropyl phthalic acid, (2-acryloyloxypropyl) tetrahydro phthalic acid and (2-acryloyloxypropyl) hexahydro phthalic acid. Of these, a single acryl monomer or a mixture of two or more acryl monomers may be used. The aforementioned alkali soluble resin includes styrene-maleic acid copolymer resin, styrene-acrylic acid copolymer resin, and rosin-maleic acid copolymer resin.

In addition to the components listed above, a common monofunctional acrylic monomer, a multifunctional acrylic monomer or a prepolymer may be added to an extent that does not hinder alkali removability, and it can prepared by appropriately adding a photopolymerization initiator, a pigment, an additive, a solvent or the like. The photopolymerization initiator includes benzophenone and derivative thereof, benzyl, benzoin and alkylether thereof, thioxantone and derivative thereof, RUSIRIN TPO, IRGACURE manufactured by Ciba Speciality Chemicals Inc., ESACURE manufactured by FRATTERI RAMBERTY? may be used. As the pigment, a color pigment may be added to provide visibility of the pattern, or an extender pigment such as silica, talc, clay, barium sulfate, calcium carbonate or the like may be additionally used. Particularly, silica has an effect of preventing blocking, when the aluminum foil is to be rolled with the ultraviolet ray curing resist ink remaining thereon. As an additive, polymerization inhibiter such as 2-tertiary butyl hydroquinone, silicon, fluorine compound, antifoaming agent such as acryl polymer, and a levelling agent are included, which may be appropriately added as needed. The solvent includes ethyl acetate, ethanol, denatured alcohol, isopropyl alcohol, toluene, MEK and the like, of which one may be used, or two or more of these may be used mixed with each other. It is preferred that the solvent is evaporated away from the resist ink layer by hot air drying or the like, after gravure printing.

Figure 7:
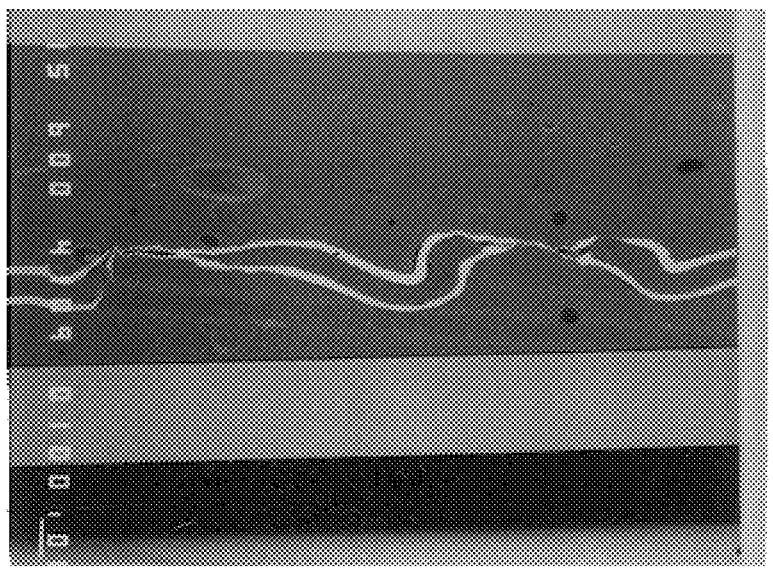
FIG. 7 is a photomicrograph of a cross section showing parts of aluminum foils, positioned on opposing sides of a resin film as the base material, brought into contact with each other in an antenna coil for an IC card in accordance with the present invention.
Figure 8:
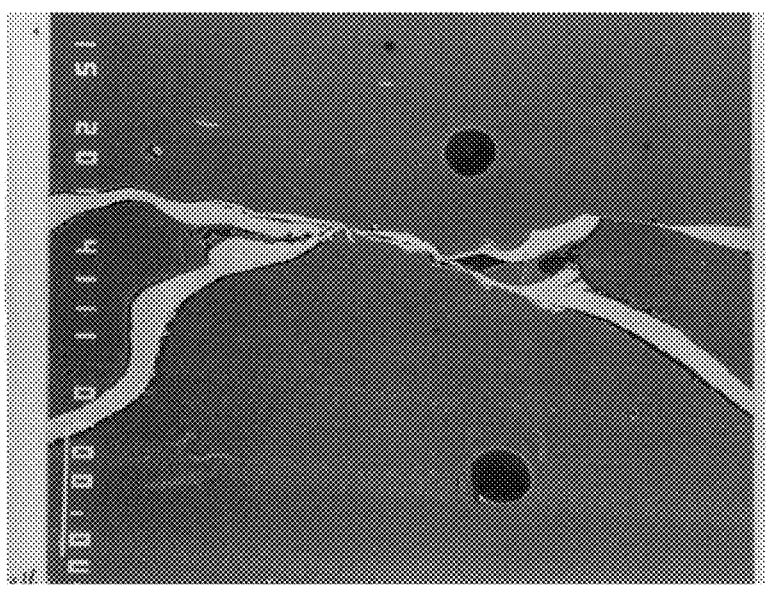
FIG. 8 is a photomicrograph showing in further enlargement a portion of the cross section of FIG. 7.
Figure 9:
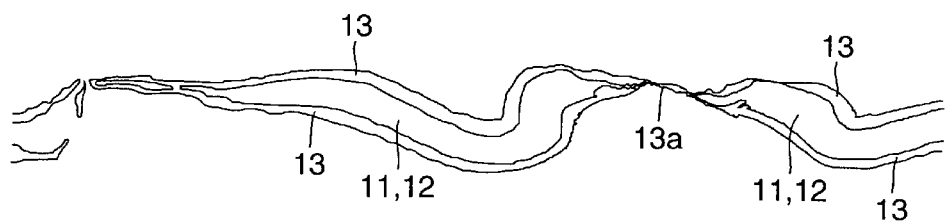
FIG. 9 is a schematic illustration of the cross section corresponding to FIG. 7.
Figure 10:
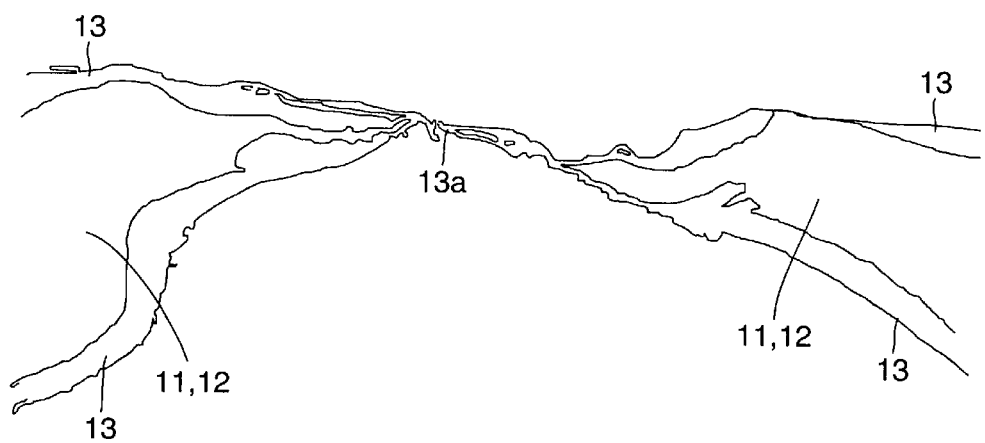
FIG. 10 is a schematic illustration of the cross section corresponding to FIG. 8.

After the circuit pattern layer is formed, crimping process is performed at a room temperature at a prescribed position, so as to establish electrical contact between portions of aluminum foils on the front and rear sides, so as to form the antenna coil. Here, the crimping process refers to a process for establishing physical contact between portions of aluminum foils constituting the circuit pattern layer, by destroying the resin film as the base material and the adhesive layer by means of a drill, a file, ultrasonic wave or the like. More specifically, the stacked body of the resin film and the aluminum foil are brought into contact with a metal plate having recesses and protrusions, and the stacked body is pressed by a metal protrusion, whereby the resin film as the base material and the adhesive layer are partially destroyed, allowing contact between the surfaces of the aluminum foils, establishing electrical conduction. FIGS. 7 and 8 are enlarged photographs of a partial cross section of the stacked body including the resin film and the aluminum foils that has been subjected to the actual crimping process. FIG. 7 is a photomicrograph with the magnification of 48, and FIG. 8 is a photomicrograph having the magnification of 160. FIGS. 9 and 10 are schematic illustrations of the cross sectional structures corresponding to the photographs of FIGS. 7 and 8.

As can be seen from FIGS. 9 and 10, surfaces of aluminum foils forming the circuit pattern layer 13 extending on both sides of adhesive layer 12 and resin film base material 11 are locally brought into contact with each other at the pressure contact portion 13a.

The structure and the method of manufacturing an antenna coil for an IC card in accordance with the present invention has been described. The following steps are continuously performed to provide the final product, that is, the IC card. IC chips are mounted on areas 13c and 13d of circuit pattern layer 13 of antenna coil 1 for the IC card shown in FIG. 1. Thereafter, a covering layer such as a white PET may be stacked by hot melt coating, for example, on the surface of the stacked body of aluminum foil and the resin film. The covering layer is not limited to white, and a well known color pigment, an extender pigment, metallic pigment such as aluminum flake, a known resin, varnish, vehicle or the like may be used. Further, a component employed in a known IC card such as a printed layer, a magnetic recording layer, a magnetic intercepting layer, an overcoating layer, a vapor deposited layer or the like may be laminated as needed.

Figure 11:
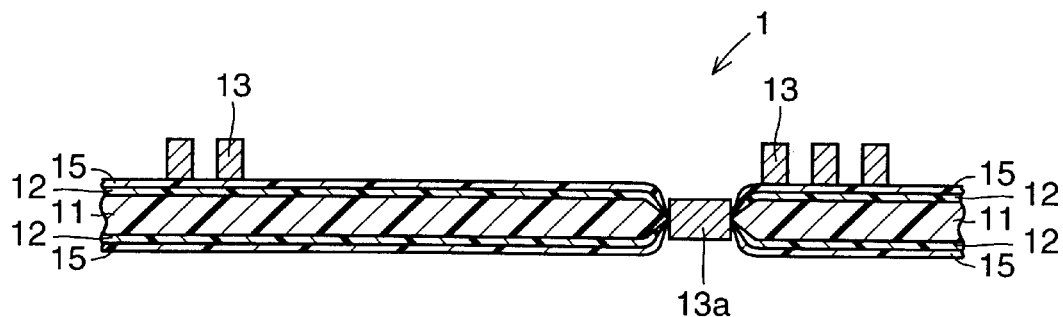
FIG. 11 shows an antenna coil for an IC card in accordance with another embodiment of the present invention, which is a partial cross section taken along the line of II—II of FIG. 1.

FIG. 11 is a partial cross section taken along the direction of the line II—II of FIG. 1, showing an antenna coil for an IC card in accordance with another embodiment of the present invention.

As can be seen from FIGS. 1 and 11, antenna coil 1 for an IC card includes a resin film base material 11, adhesive layers 12 formed on both surfaces of resin film base material 11, primer coat layers 15 as underlying coating layers formed on the surfaces of adhesive layers 12, and circuit pattern layers 13 formed of aluminum foils, formed in accordance with a prescribed pattern on the surfaces of primer coat layers 15. Circuit pattern layer 13 is formed in an eddy pattern on the surface of the base material as shown in FIG. 1. At an end portion of circuit pattern layer 13, areas 13c and 13d are formed, on which IC chips are mounted. The circuit pattern layer represented by the dotted line in FIG. 1 is positioned on the rear surface of base material 11. The circuit pattern layer 13 formed on the surface of base material 11 is in contact with the circuit pattern layer 13 formed on the rear surface of base material 11 to be electrically conductive at pressure contact portions 13a and 13b, respectively. The contact is attained by partially destroying the base material 11, adhesive layers 12 and primer coat layers 15 by the crimping process.

As the material of the primer coat layer, at least one selected from epoxy based primer, an acrylic primer, a vinyl chloride-vinyl acetate copolymer based primer and the like may be used. Preferably, the primer coat layer has the thickness of at least 0.1 μm and at most 5.0 μm. When the thickness of the primer coat layer is smaller than 0.1 μm, blocking tends to occur. When the thickness of the primer coat layer exceeds 5 μm, the antenna coil comes to have large electric resistance, making conduction with other components or lines insufficient, possibly causing heat build up or malfunction.

Another embodiment of the method of manufacturing an antenna coil for an IC card in accordance with the present invention will be described in the following. FIGS. 12 to 16 are partial cross sectional views showing the steps of manufacturing the antenna coil for an IC card in accordance with this another embodiment of the present invention. FIGS. 12 to 16 are cross sections taken along the direction of the line II—II of FIG. 1.

Figure 12:
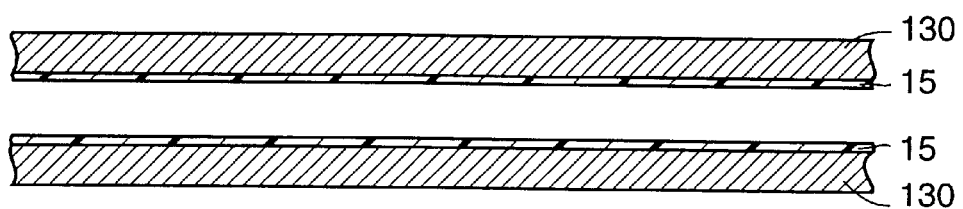
FIGS. 12 to 16 are partial cross sectional views showing in order the steps of manufacturing an antenna coil for an IC card in accordance with another embodiment of the present invention.

Referring to FIG. 12, a primer coat layer 15 is formed on one surface of each of the two aluminum foils 130. In this manner, before adhering the aluminum foil 130 to the resin film base material 11, primer coat process is performed at least partially and preferably on one surface of aluminum foil 130, to form a primer coat layer. The method of forming the primer coat layer is not particularly limited and it can be formed by brush coating, dipping, roller coater, bar coater, doctor blade, spray coating, printing or the like. Preferable method is gravure printing.

After the primary coat layer is formed, it is preferred that drying and curing process is performed at a temperature of about 50° C. to about 250° C. for about 5 to about 300 seconds, for sufficient curing.

Figure 13:
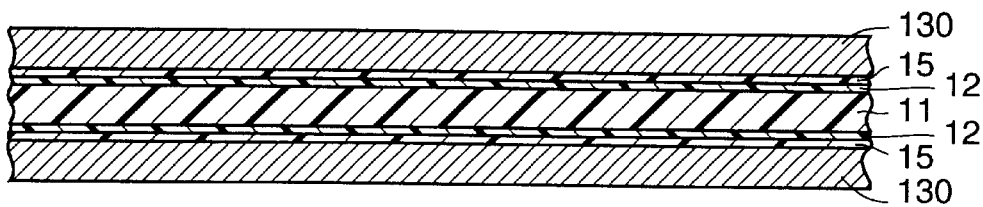

Referring to FIG. 13, adhesive layers 12 are formed on opposing surfaces of resin film base material 11, and by the adhesive layers 12, one surface of respective ones of the aluminum foils 130 on which primer coat layer 15 has been formed is fixed on each surface of resin film base material 11. In this manner, a stacked body of aluminum foils 130 and resin film base material 11 is prepared.

Figure 14:
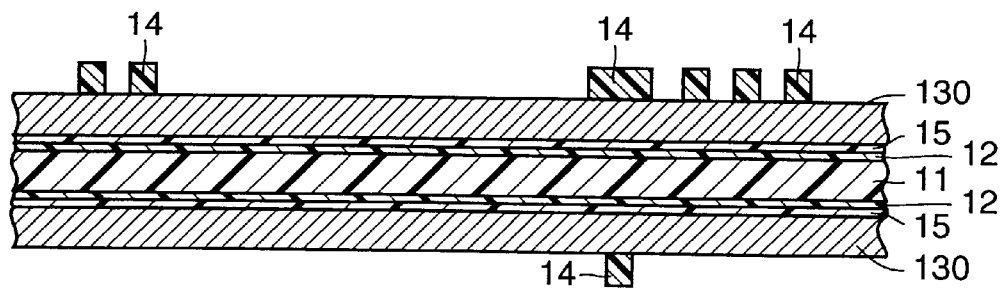

Referring to FIG. 14, resist ink layer 14 is printed on the surface of each aluminum foil 130 to have prescribed eddy patterns in accordance with the specification of the antenna coil. After printing, curing process of the resist ink layer 14 is performed.

Figure 15:
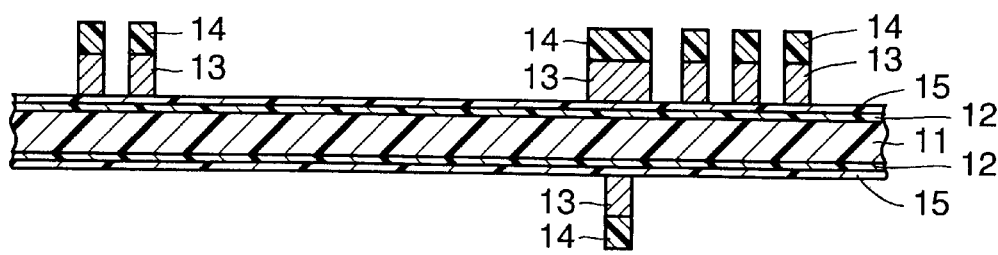

Referring to FIG. 15, using the resist ink layers 14 as a mask, aluminum foils 130 are etched, whereby circuit pattern layers 13 are formed.

Figure 16:
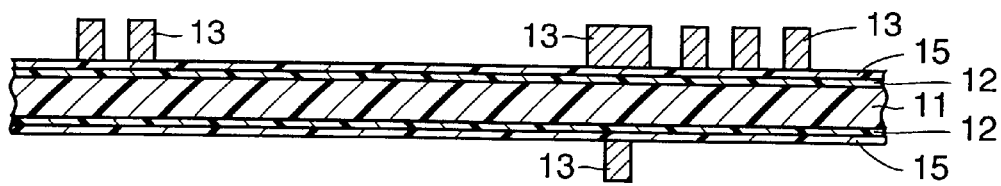

Thereafter, as shown in FIG. 16, resist ink layers 14 are removed.

Finally, using a metal plate having recesses and protrusions and a metal protrusion, crimping process is performed at a prescribed region of circuit pattern layers 13, so as to form the contact portion or pressure contact portion 13*a* of the circuit pattern layer, as shown in FIG. 11. In this manner, an antenna coil 1 for an IC card in accordance with the present invention is completed.

EXAMPLE 1

On opposing surfaces of a base material of low profile polyethylene naphthalate having the thickness of 50 μm, aluminum foils (an aluminum foil having the thickness of 30 μm on one surface and aluminum foil having the thickness of 20 μm on the other surface of the base material) having such a chemical composition (mass %) as shown in Table 1 were adhered by dry lamination method using a polyurethane based adhesive containing epoxy, to form circuit pattern layers, whereby a stacked body was prepared.

TABLE 1

| sample name | Fe | Si | Cu | Mn | Mg | Zn | Ti | Ga | Al |
|---|---|---|---|---|---|---|---|---|---|
| A | 1.4 | 0.09 | 0.03 | tr. | tr. | tr. | tr. | tr. | remaining part |
| B | 1 | 0.07 | 0.02 | tr. | tr. | tr. | tr. | tr. | remaining part |
| C | 0.5 | 0.1 | 0.05 | tr. | tr. | tr. | tr. | tr. | remaining part |
| D | 0.03 | 0.05 | 0.01 | tr. | tr. | tr. | tr. | tr. | remaining part |

In Table 1, "tr" represents that it is smaller than 0.01 mass %.

For preliminary evaluation, mechanical properties of the thus obtained stacked body was evaluated by tension test. Results are as shown in Table 2. In Table 2, tensile strength and proof stress are represented by the unit of N/15 mm width.

TABLE 2

| | longitudinal direction | | | lateral direction | | |
|---|---|---|---|---|---|---|
| sample name | tensile strength | proof stress | elongation (%) | tensile strength | proof stress | elongation (%) |
| A | 220 | 60 | 81 | 215 | 62 | 82 |
| B | 213 | 55 | 69 | 212 | 55 | 73 |
| C | 203 | 53 | 64 | 204 | 52 | 65 |
| D | 201 | 51 | 55 | 203 | 47 | 55 |

As a preliminary evaluation of emboss processability, bursting strength was evaluated by applying pressure. Measurement of burst strength was performed in accordance with the method specified in JIS P8112. Results are as shown in Table 3.

TABLE 3

| sample name | bursting strength (N/cm$^2$) |
|---|---|
| A | 186 |
| B | 181 |
| C | 171 |
| D | 165 |

From Tables 1 to 3, it can be understood that tensile strength, elongation and bursting strength attain higher as iron content is higher. Therefore, in stacked bodies (samples A and B) to which aluminum foil with low aluminum purity are adhered, possibility of tearing or possibility of circuit disconnection is lower even when emboss processing or the like is performed during manufacturing of the IC card or when deforming stress is applied while the IC card is used, as compared with the samples having higher aluminum purity (sample D).

Thereafter, on both surfaces of the stacked body, a print pattern such as shown in FIG. 1 was printed using a resist ink of the following composition by helioklisho gravure printing. After printing, the resulting body was irradiated with an ultraviolet ray lamp having the exposure of 480 W/cm for 15 seconds to cure the resist ink, and thus a resist ink layer was formed.

Ink composition was as follows.

Beckacite J-896 (Rogin-maleic acid resin manufactured by Dainippon Ink & Chemicals): 21 parts by weight 2-acryloyl hexyethylhexa hydrophtalic acid: 25 parts by weight Unidic V-5510 (a mixture of prepolymer and monomer manufactured by Dainippon Ink & Chemicals): 8 parts by weight

| IRGACURE 184: | 3 parts by weight |
|---|---|
| Ethyl acetate: | 28 parts by weight |
| Denatured alcohol: | 12 parts by weight |
| Phthalocyanine blue: | 1 parts by weight |
| Silica: | 2 parts by weight. |

The stacked body with the resist ink layer formed in the above described manner was dipped in a hydrochloric acid solution, which was diluted at a volume ratio of 1 (hydrochloric acid): 3 (pure water), under the etching conditions (temperature, time) as shown in Table 4, so as to etch the aluminum foil, and the circuit pattern layer in accordance with the prescribed pattern was formed. Thereafter, the stacked body was dipped in a sodium hydroxide solution of 1% at 20° C. for 10 seconds, so as to remove the resist ink. Thereafter, the stacked body was dried with hot air of 70° C., whereby a stacked body such as shown in FIG. 6 was fabricated.

By performing the crimping process using a metal plate having recesses and protrusions and a metal protrusion at a prescribed position of the stacked body obtained in this manner, an antenna coil for an IC card such as shown in FIG. 2 was fabricated.

In the step of etching the aluminum foil described above, etching characteristics of samples A, B, C and D were evaluated.

Table 4 represent line widths of aluminum of respective samples obtained under respective etching conditions.

TABLE 4

| sample name | etching condition temp (° C.) | time (sec.) | aluminum line width (mm) |
|---|---|---|---|
| A | 45 | 124 | 0.3 |
| B | 45 | 124 | 0.31 |
| C | 45 | 124 | 0.39 |
| D | 45 | 124 | >0.60 |
| A | 40 | 124 | 0.37 |
| B | 40 | 124 | 0.37 |
| C | 40 | 124 | 0.43 |
| D | 40 | 124 | >0.60 |
| A | 35 | 124 | 0.38 |
| B | 35 | 124 | 0.39 |
| C | 35 | 124 | 0.46 |
| D | 35 | 124 | >0.60 |
| A | 45 | 70 | 0.41 |
| B | 45 | 70 | 0.41 |
| C | 45 | 70 | 0.47 |
| D | 45 | 70 | >0.60 |
| A | 45 | 52 | 0.45 |
| B | 45 | 52 | partially left |
| C | 45 | 52 | almost fully left |
| D | 45 | 52 | fully left |

From Table 4, it can be seen that when etching temperature (etchant temperature) is 45° C., the etching time necessary to attain the target line width (0.40 mm) was about 124 seconds for sample C, and about 70 seconds for samples A and B. For sample D (comparative example), the line width was wider than 0.6 mm even after the etching of 124 seconds. From these results, it can be understood that efficient production of an antenna coil for an IC card is possible by samples A and B that use the aluminum foil containing iron within the range of the present invention. In Sample A, etching to the line width of 0.45 mm was possible by the etching time of 52 seconds.

Further, influence of etching temperature was studied while maintaining the etch time constant at 124 seconds. Satisfactory etching was possible for samples A and B even when etching temperature lowers, while line width became wider in sample D, and therefore it is understood that etching amount was insufficient when the temperature was decreased.

Figure 17:
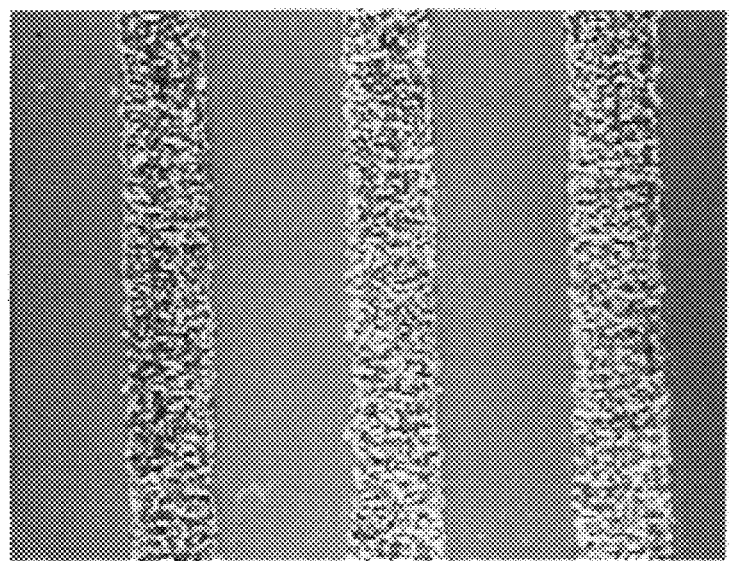
FIG. 17 is a photomicrograph of a surface of sample A etched at a temperature of 35° C. for 124 seconds.
Figure 18:
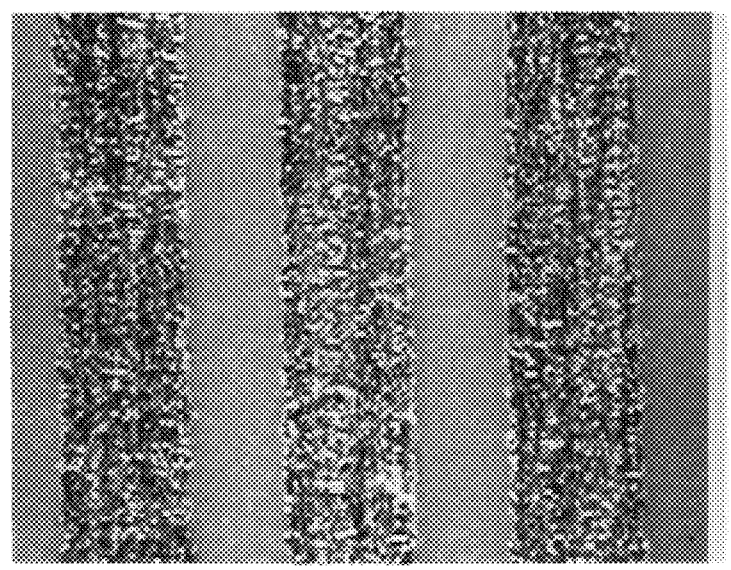
FIG. 18 is a photomicrograph of a surface of sample C etched at a temperature of 35° C. for 124 seconds.
Figure 19:
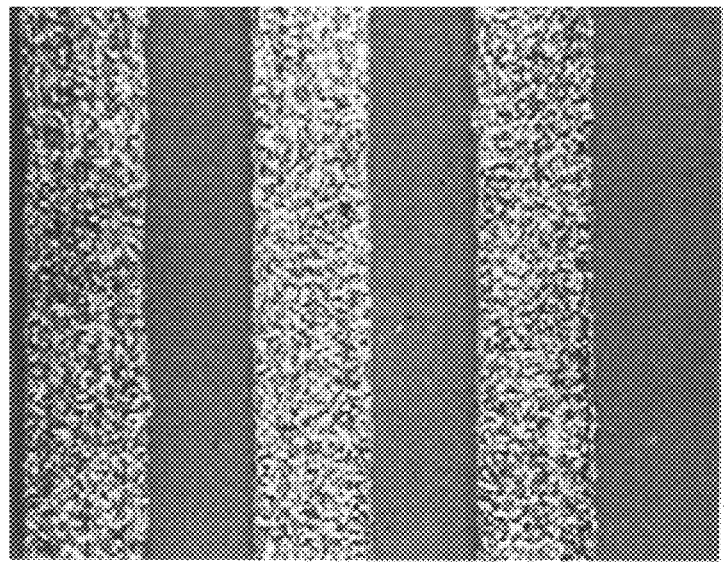
FIG. 19 is a photomicrograph of a surface of sample A etched at a temperature of 45° C. for 52 seconds.
Figure 20:
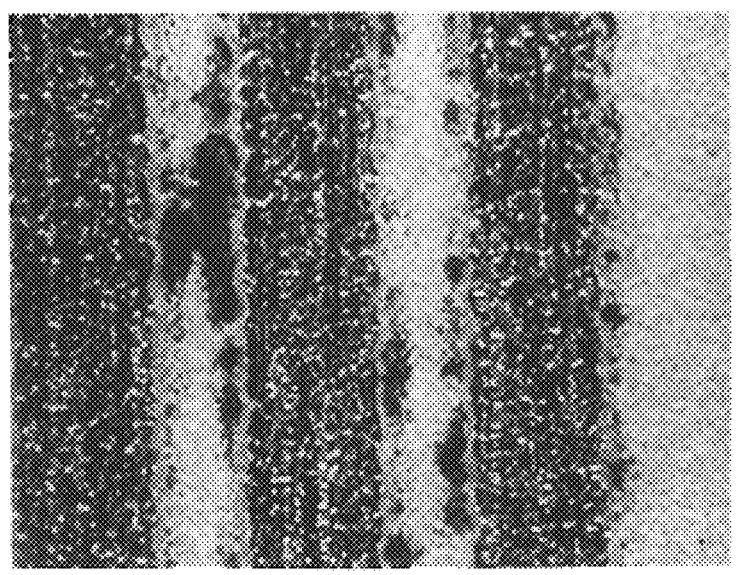
FIG. 20 is a photomicrograph of a surface of sample C etched at a temperature of 45° C. for 52 seconds.

FIGS. 17–20 are photographs with the magnification of about 35 of surfaces of samples A and C etched at a temperature of 35° C. for 124 seconds and samples A and C etched at a temperature of 45° C. for 52 seconds, respectively. In FIGS. 17–19, the linear circuit pattern layers look rough with black-white mixed pattern and the resin film base material exposed by etching aluminum foil looks gray. In FIG. 20, the surface of aluminum foil after the resist ink layer was removed looks black with white dots and the surface of aluminum foil left without being etched looks gray.

EXAMPLE 2

On opposing surfaces of base materials formed of resin films of such thickness and materials as shown in Table 5, foils of such thickness and material as shown in Table 5 were adhered by dry lamination method using the adhesives of the materials as shown in Table 5, to form circuit pattern layers, whereby stacked bodies were fabricated. On both sides of each of the stacked body prepared in this manner, a print pattern such as shown in FIG. 1 was printed using a resist ink having such a composition as described below by helioklisho gravure printing. After printing, the resulting bodies were irradiated with an ultraviolet lamp having the exposure of 480 W/cm for 15 seconds to cure the resist ink, thereby resist ink layers were formed.

Ink composition was as follows.

Beckacite J-896 (Rogin-maleic acid resin manufactured by Dainippon Ink & Chemicals): 21 parts by weight 2-acryloyl hexyethylhexa hydrophtalic acid: 25 parts by weight Unidic V-5510 (a mixture of prepolymer and monomer manufactured by Dainippon Ink & Chemicals): 8 parts by weight.

| IRGACURE 184: | 3 parts by weight |
|---|---|
| Ethyl acetate: | 28 parts by weight |
| Denatured alcohol: | 12 parts by weight |
| Phthalocyanine blue: | 1 parts by weight |
| Silica: | 2 parts by weight. |

The stacked body having the resist ink layer formed in the above described manner was dipped in a ferric chloride solution of 35% at 40° C. for 5 minutes to etch the aluminum foil, and a circuit pattern layer in accordance with a prescribed pattern was formed. Thereafter, the stacked body was dipped in a sodium hydroxide solution of 1% at 20° C. for 10 seconds, so as to remove the resist ink layer. The stacked body was dried with hot air of 70° C., whereby a stacked body such as shown in FIG. 6 was fabricated.

By performing the crimping process using a metal plate having recessed and protruded portions and a metal protrusion at a prescribed position of the stacked body obtained in this manner, an antenna coil for an IC card such as shown in FIG. 2 was fabricated.

Antenna coils of the thus obtained samples were held in a thermostat of 150° C. for 30 minutes, taken out therefrom and cooled to the room temperature. Thereafter, appearances of the antenna coils were visually observed, and thermal contraction coefficient was measured by measuring the length of the base materials, to evaluate dimensional accuracy. Results of evaluation are as shown in Table 5.

TABLE 5

| Sample No. | base material material | thickness ($\mu$m) | adhesive material | circuit pattern layer front side material | thickness ($\mu$m) | rear side material | thickness ($\mu$m) | thermal contraction coefficient (%) MD | TD | appearance | overall evaluation |
|---|---|---|---|---|---|---|---|---|---|---|---|
| 1 | low profile PET | 38 | epoxy containing PU | Al | 30 | Al | 10 | 0.13 | 0.04 | ○ | ○ |
| 2 | low profile PET | 38 | epoxy containing PU | Al | 30 | Al | 10 | 0.08 | 0.02 | ○ | ○ |
| 3 | general PET | 38 | epoxy containing PU | Al | 30 | Al | 10 | 1.52 | 0.23 | × | × |
| 4 | general PET | 38 | epoxy containing PU | Al | 30 | Al | 10 | 0.41 | 0.08 | Δ | Δ |
| 5 | low profile PET | 50 | epoxy containing PU | Al | 20 | Al | 20 | — | — | — | — |
| 6 | low profile PET | 50 | epoxy containing PU | Cu | 18 | Cu | 18 | — | — | — | — |
| 7 | CPP | 38 | epoxy containing PU | Al | 30 | Al | 10 | — | — | × | × |
| 8 | polyimide | 25 | PU | Cu | 18 | Cu | 18 | — | — | Δ | Δ |

The antenna coils of Sample Nos. 1 and 2 in accordance with the present invention had small thermal contraction coefficient and good appearance. By contrast, in the antenna coils of Sample Nos. 3 and 4, the thermal contraction coefficient was small in the TD (traverse direction: direction vertical to the direction of rolling), while it was high in MD (machine direction: rolling direction), and it was recognized that dimensional accuracy of the circuit pattern layer was degraded. In the antenna coil of Sample No. 7, cast propylene was used as the base material, and hence it melted when held at 150° C. for 30 minutes. In Sample No. 8, polyimide film was used as the base material, polyurethane adhesive (PU) not containing epoxy resin was used as the adhesive, and copper foil was used as the material for the circuit pattern layer. Warp was generated while it was left at the room temperature, and appearance was not satisfactory.

In Table 5, appearance evaluation are as follows: satisfactory appearance: ○, crease and flexure observed: Δ, and deformed and unusable: X.

Using antenna coils of Sample Nos. 1, 2, 5, 6 and 8 of Table 5, conduction characteristics of portions that had been subjected to crimping process were evaluated.

For Sample Nos. 1, 2 and 5, high temperature retention test at a temperature of 180° C. for 1 minute and in addition at a temperature of 150° C. for 1 hour with the initial conduction resistance at the crimping portion of 0.04Ω, and heat press test at a temperature of 120° C. for 5 minutes with the pressure of 5 kg/cm$^2$ were performed, and the conduction resistance was maintained at 0.04Ω. For Sample No. 6, in the high temperature retention test with the initial value of conduction resistance at the crimping portion being 0.04Ω, the conduction resistance was maintained at 0.04Ω, while in the heat press test, the crimping portion became non-conductive. In Sample No. 8 with the initial value of conduction resistance at the crimping portion being 0.04Ω, crimping portion became non-conductive in both of the two tests described above.

EXAMPLE 3

As shown in FIG. 12, epoxy coating agent No. 8800 (manufactured by Tanaka Chemical Kabushiki Kaisha) was applied to have the thickness of 1.5 $\mu$m after drying as the primer coat processing, on one surface, of each of aluminum coils (tape-shaped) (JIS IN30-O) having the thickness of 30 $\mu$m and 20 $\mu$m, respectively, as metal foils 130, and thereafter dried and cured at a temperature of 200° C. for 30 seconds. In this manner, primer coat layer 15 was formed on one surface of each of the two aluminum foil coils.

Thereafter, referring to FIG. 13, one surface of the aluminum foil coil having the thickness of 30 $\mu$m on which primer coat layer 15 had been formed was adhered by an adhesive layer 12 to one surface of a PET film having the thickness of 38 $\mu$m as a resin film base material 11, and one surface of the aluminum foil coil having the thickness of 20 $\mu$m on which primer coat layer 15 had been formed was adhered to the other surface of the PET film, whereby a stacked body coil material was fabricated. An epoxyurethane dry laminate adhesive AD76P1 (manufactured by Toyo-Morton, Ltd.) was used as the adhesive, and the amount of adhesive applied was 4 g/m$^2$ by weight after drying.

Referring to FIG. 14 on the other surface of the aluminum foil coil as the metal foil 130, resist ink layer 14 having such a circuit pattern as shown in FIG. 1 was printed continuously and repeatedly. As the resist ink, the material similar to that used in Example 2 was used, and the amount of applied resist ink was 5 g/m$^2$ by weight after drying.

Using resist ink layer 14 formed in this manner as a mask, the aluminum foil was etched to form a circuit pattern layer 13 as shown in FIG. 15. Ferric chloride solution was used as the etchant.

Thereafter, as shown in FIG. 16, resist ink layer 14 was removed by using sodium hydroxide solution.

Finally, crimping process for establishing electrical conduction between the front end and back was performed using a metal plate having recesses and protrusions and a metal protrusion, at a prescribed position on the surfaces of the stacked body coil material, whereby a tape-shaped material for the antenna coils for IC cards having such a cross section as shown in FIG. 11 was fabricated.

Thereafter, the tape-shaped material of the antenna coils for IC cards was rolled to a coil with a tension of 1.96× $10^2$ N/m (width) by a take up apparatus.

EXAMPLE 4

The tape-shaped material of antenna coils for IC cards was fabricated through the same process steps as Example 3, except that an epoxy-melamine coating agent No. 952-H (Manufactured by Tanaka Chemical Kabushiki Kaisha) was applied to the thickness of 2 μm after drying, as the primer coat process.

EXAMPLE 5

The tape-shaped material of antenna coils for IC cards was fabricated through the same process steps as Example 3, except that a PEN film having the thickness of 38 μm was used as the resin film base material.

EXAMPLE 6

The tape-shaped material of antenna coils for IC cards was fabricated through the same process steps as Example 3, except that an epoxy coating agent No. 8800 (manufactured by Tanaka Chemical Kabushiki Kaisha) was applied to have the thickness of 0.05 μm after drying as the primer coat process.

EXAMPLE 7

The tape-shaped material of antenna coils for IC cards was fabricated through the same process steps as Example 3, except that an epoxy coating agent No. 8800 (manufactured by Tanaka Chemical Kabushiki Kaisha) was applied to have the thickness of 6 μm after drying as the primer coat process.

REFERENCE EXAMPLE 1

A tape-shaped material of antenna coils for IC cards was fabricated through the same process steps as Example 3, except that the primer coat process was not performed on the aluminum foil coil material.

Thus prepared tape-shaped materials were held at prescribed temperatures shown in Table 6 for 48 hours, and thereafter, end portions of each tape-shaped material was held by ends to evaluate whether there was a blocking. Evaluation was in accordance with the following indexes.

Evaluation 5: overlapping portions are separated smooth without the necessity of pulling, when the tape-shaped material is unrolled.

Evaluation 4: though there is a faint sound when the tape-shaped material is unrolled, overlapping portions were separated without the necessity of applying a particularly strong force.

Evaluation 3: overlapping portions were separated only when a force is applied to unroll the tape-shaped material, though the force is not very strong.

Evaluation 2: though overlapping portions were separated when force was applied to unroll the tape-shaped material, the material was partially damaged.

Evaluation 1: overlap portions were tightly adhered and not separated even when force was applied to unroll the tape-shaped material.

Of these evaluations, evaluation 5 is the highest for the product of the tape-shaped material for antenna coils. In order to prevent any trouble in the subsequent manufacturing line for IC cards, the product must have the evaluation of 4 or higher.

Further, electrical resistance value of the crimping portions of the prepared tape-shaped materials were measured by a tester.

Further, appearances of the circuit pattern layers obtained through etching were evaluated.

The evaluation was performed by visually observing defective etching including disconnection, thinning and peeling of the circuit pattern layers. Products without any defective etching was evaluated as "good", and products that may possibly have problems in performance as an antenna coil product was evaluated as "not good."

The results are as shown in Table 6.

TABLE 6

| material | blocking evaluation (in 5 stages) | | resistance value evaluation | |
|---|---|---|---|---|
| | held at 40° C. | held at 60° C. | at crimping portion | etching appearance |
| Ex. 3 | 5 | 5 | at most 0.1 Ω | good |
| Ex. 4 | 5 | 5 | at most 0.1 Ω | good |
| Ex. 5 | 5 | 5 | at most 0.1 Ω | good |
| Ex. 6 | 4 | 4 | at most 0.1 Ω | good |
| Ex. 7 | 5 | 5 | 0.8 Ω | good |
| Reference Ex. 1 | 2 | 1 | at most 0.1 Ω | good |

From Table 6, it can be understood that Examples 3 to 7 have the blocking evaluation of 4 or higher, while blocking evaluation is 1 for the Reference Example 1 that does not have the primer coat processing. In Example 6, as the thickness of the primer coat layer was smaller than 0.1 μm, blocking is more likely as compared with Examples 3 to 5, so that blocking evaluation is slightly lower. In Example 7, as the primer coat layer has the thickness larger than 5 μm, electrical resistance value of the crimping portion was increased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An antenna coil for an IC card, comprising:
   a base material containing resin and having a thickness of at least 15 μm and at most 70 μm; and
   a circuit pattern layer formed on a surface of said base material, having a thickness of at least 7 μm and at most 60 μm, formed of a foil containing aluminum of at least 97.5 mass % and at most 99.7 mass %.

2. The antenna coil for an IC card according to claim 1, wherein
   said foil contains iron by at least 0.7 mass % and at most 1.8 mass %.

3. The antenna coil for an IC card according to claim 1, wherein
   said foil contains silicon by at least 0.03 mass % and at most 0.5 mass %.

4. The antenna coil for an IC card according to claim 1, wherein
   said foil contains silicon by at least 0.03 mass % and at most 0.5 mass %, and copper by at most 0.3 mass %.

5. The antenna coil for an IC card according to claim 1, wherein
said base material includes a resin having thermal contraction coefficient of at most 0.3% when held at 150° C. for 30 minutes.

6. The antenna coil for an IC card according to claim 1, wherein
said resin is at least one selected from the group consisting of low profile polyethylene terephthalate and low profile polyethylene naphthalate.

7. The antenna coil for an IC card according to claim 1, wherein
said circuit pattern layer includes a first circuit pattern layer formed on one surface of said base material and a second circuit pattern layer formed on the other surface of said base material.

8. The antenna coil for an IC card according to claim 7, wherein
at least a part of said first circuit pattern layer is in contact with at least a part of said second circuit pattern layer penetrating through said base material.

9. The antenna coil for an IC card according to claim 1, further comprising
an adhesive layer interposed between and bonding said circuit pattern layer and said base material.

10. The antenna coil for an IC card according to claim 9, wherein
said adhesive layer includes a polyurethane based adhesive containing an epoxy resin.

11. The antenna coil for an IC card according to claim 1, further comprising
an underlying coating layer interposed between said circuit pattern layer and said base material and formed on a surface of said base material.

12. The antenna coil for an IC card according to claim 11, further comprising
an adhesive layer posed between and bonding said underlying coating layer and said base material.

13. The antenna coil for an IC card according to claim 12, wherein
said adhesive layer includes a polyurethane based adhesive containing an epoxy resin.

14. The antenna coil for an IC card according to claim 11, wherein
said underlying coating layer has a thickness of at least 0.1 μm and at most 5 μm.

15. The antenna coil for an IC card according to claim 11, wherein
said underlying coating layer includes at least one selected from the group consisting of epoxy based primer, acrylic primer, and vinyl chloride-vinyl acetate copolymer based primer.

16. A method of manufacturing an antenna coil for an IC card, comprising the steps of:
fixing, on a surface of a base material containing resin and having a thickness of at least 15 μm and at most 70 μm, a foil containing aluminum by at least 97.5 mass % and at most 99.7 mass % and having a thickness of at least 7 μm and at most 60 μm by using an adhesive;
printing a resist ink layer having a prescribed pattern on said foil;
etching said foil using said resist ink layer as a mask to form a circuit pattern layer containing aluminum; and
after etching said foil, removing said resist ink layer.

17. The method of manufacturing an antenna coil for an IC card according to claim 16, wherein
said step of fixing said foil includes fixing said foil on one surface and on the other surface of said base material, and
said step of forming said circuit pattern layer includes forming a first circuit pattern layer on one surface of said base material and forming a second circuit pattern layer on the other surface of said base material.

18. The method of manufacturing an antenna coil for an IC card according to claim 17, further comprising the step of
bringing at least a part of said first circuit pattern layer into contact with at least a part of said second circuit pattern layer by a crimping process.

19. The method of manufacturing an antenna coil for an IC card according to claim 16, wherein
said step of fixing said foil on a surface of said base material includes, after forming an underlying coating layer on one surface of said foil, adhering said base material to a surface of said underlying coating layer, and
said step of printing a resist ink layer having a prescribed pattern on said foil includes printing of a resist ink layer having a prescribed pattern on the other surface of said foil.

20. The method of manufacturing an antenna coil for an IC card according to claim 16, wherein
said step of fixing said foil on a surface of said base material includes fixing said foil on a surface of said base material using a polyurethane based adhesive containing an epoxy resin.

* * * * *

UNITED STATES PATENT AND TRADEMARK OFFICE
CERTIFICATE OF CORRECTION

PATENT NO.   : 6,400,323 B2
DATED        : June 4, 2002
INVENTOR(S)  : Yasukawa et al.

It is certified that error appears in the above-identified patent and that said Letters Patent is hereby corrected as shown below:

<u>Column 4,</u>
Line 28, after "Etching", replace "apart" by -- a part --.

<u>Columns 15 and 16,</u>
Table 5, under the heading "base material", Sample No. 2, replace "PET" by -- PEN --.
Under the heading "base material", Sample No. 4, replace "PET" by -- PEN --.

Signed and Sealed this

Twenty-third Day of July, 2002

Attest:

Attesting Officer

JAMES E. ROGAN
Director of the United States Patent and Trademark Office